United States Patent Office
3,690,890
Patented Sept. 12, 1972

3,690,890

PHOTORESIST COMPOSITION

Hiroyoshi Yamaguchi and Akio Iwaki, Tokyo, and Hirosi Tokura, Tsuru, Japan, assignors to Konishiroku Photo Industry Co., Ltd., Tokyo, Japan No Drawing. Filed Oct. 26, 1970, Ser. No. 84,114
Claims priority, application Japan, Oct. 31, 1969, 44/86,886
Int. Cl. G03c *1/70*
U.S. Cl. 96—90 R 8 Claims

ABSTRACT OF THE DISCLOSURE

A photoresist-forming composition comprising a photo activator having a polychlorinated or polybrominated methyl group capable of forming a free radical by the action of light: a homopolymer or a co-polymer with other vinyl monomer, of a monomer represented by the general formula

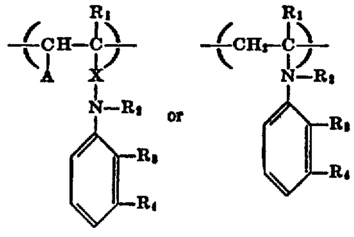

[I] or [II]

wherein A is a hydrogen atom, a carboxylic acid or carboxylic acid amide; X is $—COOCH_2CH_2—$, $—CONHCH_2CH_2—$ —CONH—, $—CH_2—$, $—\phi SO_2NH—$, $—\phi SO_2O\phi—$, $—CONH\phi—$; $R_1$ is a hydrogen atom or a lower alkyl group; $R_2$ is a hydrogen atom, a lower alkyl group or a substituted or unsubstituted phenyl group; and $R_3$ and $R_4$ are individually a hydrogen atom or a lower alkyl group, provided that in the case of the Formula II, $R_2$ and $R_3$ may form a heterocyclic ring together with nitrogen and the benzene ring, and $R_3$ and $R_4$ may form a naphthalene ring together with the benzene ring; and a cellulose ether.

This invention relates to a photoresist composition comprising a polyhalomethyl group-bearing photoactivator capable of yielding a free radical by the action of light, a cellulose ether and a polymer. When the photoresist composition of the present invention is irradiated with light, the polymer crosslinks to bring about photo-hardening, and when the photo-hardened composition is subjected to development treatment, it is possible to obtain a relief image useful for anastatic printing, lithographic printing, gravure printing, etc.

As conventional polymer-containing light-sensitive compositions, there have been known a combination of gelatine with a bichromate, a combination of polyvinyl alcohol with a bichromate, a combination of a diazo compound with a polyvinyl resin, and a polyvinyl cinnamoate resin obtained by the photo-dimerization of cinnamic acid. However, a relief image, which is obtained by exposing a photographic material containing such conventional light-sensitive composition through a negative film and then treating the exposed material with a developer, is low in chemical resistance. Particularly in the case of an anastatic printing plate, which is obtained by coating such a light-sensitive composition as mentioned above on a metal plate, e.g. a magnesium, zinc or aluminum plate, drying the coated composition, closely contacting a negative film onto the plate coated with the light-sensitive composition, exposing the plate to a carbon arc lamp or the like and then developing the exposed plate, a relief image formed after the development does not become resistant to etching unless it is reinforced by burning or by ultraviolet irradiation.

The light-sensitive composition of the present invention is composed of a photoactivator, a polymer and a cellulose ether. The present light-sensitive composition is prominent in film-forming ability, and the resulting film forms, when exposed to light, a photo-hardened portion which is not only high in physical and chemical strengths but also quite excellent in chemical resistance. Since a film formed from the present light-sensitive composition is excellent in chemical resistance of the photo-hardened portion, the film is enhanced in developability after exposure, and a relief image obtained after development of the film can sufficiently withstand such treatments as counter-etch, Dow etch and the like, without being subjected to burning or ultraviolet irradiation, and does not undergo any such qualitative degradation as exfoliation, corrosion, damage, cracking, etc.

The polymer used in the present invention is a homopolymer of a monomer represented by the general Formula I or II,

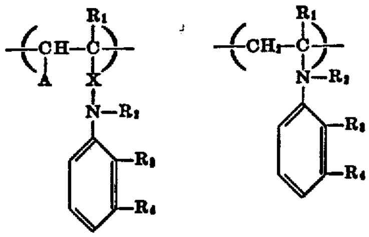

(I) (II)

wherein A is a hydrogen atom or a carboxyl group; X is a group capable of linking the carbon in the main chain to the nitrogen of an aromatic amino group; $R_1$ is a hydrogen atom or a lower alkyl group; $R_2$ is a hydrogen atom, a lower alkyl group or a phenyl group; and $R_3$ and $R_4$ are individually a hydrogen atom or a lower alkyl group, provided that in the Formula II. $R_2$ and $R_3$ may form a heterocyclic ring, together with the nitrogen atom and the benzene ring, or $R_3$ and $R_4$ may form a naphthalene ring, together with the benzene ring. Sometimes, the polymer used in the present invention may be a copolymer of said monomer with any other vinyl monomer including styrene, acrylonitrile, vinyl acetate, acrylic acid, methacrylic acid, itaconic acid, methyl acrylate, ethyl acrylate, butyl acrylate, methyl methacrylate, methyl α-chloroacrylate, maleic anhydride, vinylidene chloride, etc. Typical examples of the above-mentioned polymers are as set forth below, but it is needless to say that polymers usable in the present invention are not limited to these.

(1)

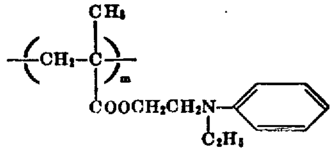

(2)

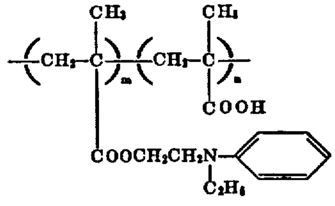

(3)
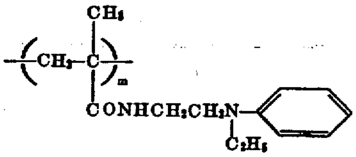
(4)
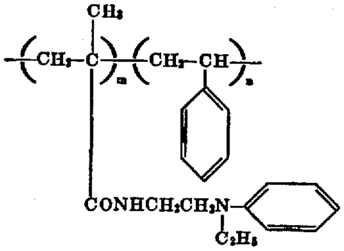
(5)
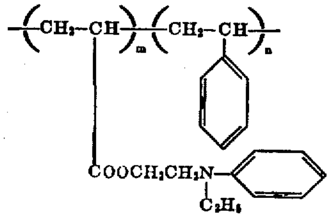
(6)
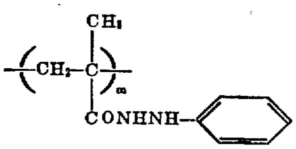
(7)
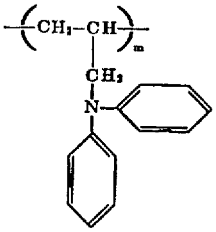
(8)
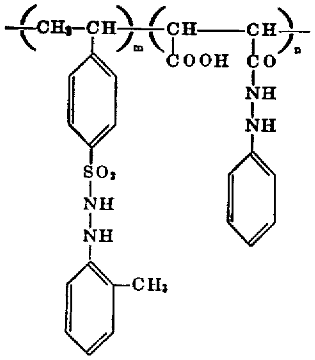
(9)
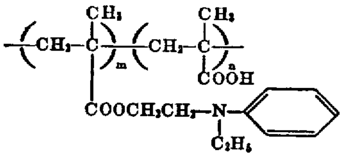
(10)
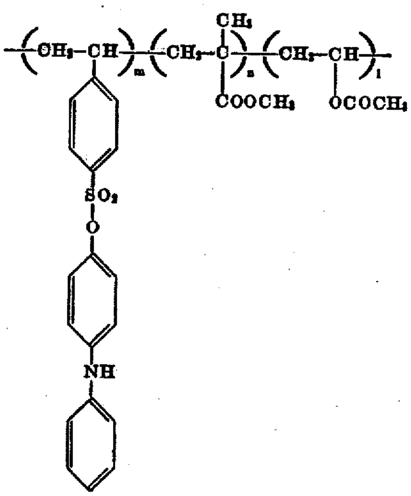
(11)
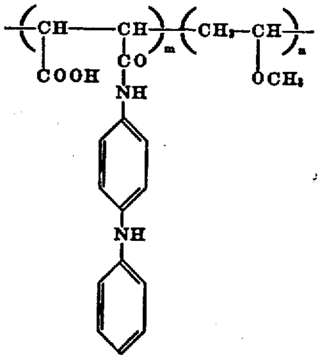
(12)
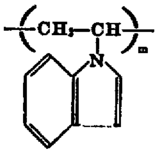
(13)
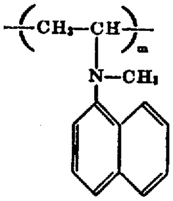
(14)
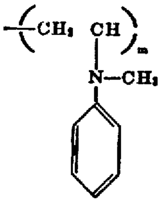
(15)
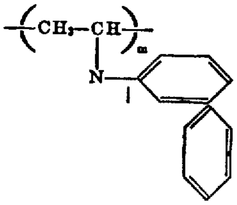

(16)

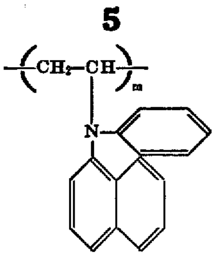

Procedures for synthesizing the polymers used in the present invention are set forth in the following synthesis examples.

SYNTHESIS EXAMPLE 1

Synthesis of exemplified compound (1)

1 mol of N-ethyl-N-phenylaminoethanol was dissolved in 500 cc. of pyridine, and the resulting solution was cooled to 0° C. Into this solution was gradually dropped, with stirring 1 mol of methacrylic acid chloride. After the dropping, the resulting mixture was stirred at room temperature for 2 to 3 hours, and then poured into a large amount of ice water to deposit an oily substance. The oily substance was extracted with ether, and the extract was washed with water until no pyridine odor had been detected. This ether solution was dried over sodium sulfate and then added with a small amount of hydroquinone. Subsequently, the ether was removed under reduced pressure, and the residue was subjected to distillation at 135° C. and 4 mm. Hg to obtain N-ethyl-N-phenylaminoethyl methacrylate. 1 g. of this methacrylate was dissolved in 10 cc. of methylethylketone, and the resulting solution was added with 5 mg. of α,α′-azobisisobutyronitrile and then heated at 60° C. for 5 hours, whereby a polymer solution was obtained. This solution was poured into ether to precipitate the exemplified compound (1) as a white polymer.

SYNTHESIS EXAMPLE 2

Synthesis of exemplified compound (4)

1 mol of N-ethyl-N-phenylaminoethylamine was dissolved in 620 cc. of pyridine. Into this solution was gradually dropped at 0° to 10° C. 1 mol of methacrylic acid chloride. After the dropping, the resulting mixture was stirred for 3 hours and, after completion of the reaction, a pyridine hydrochloride formed was separated by filtration. The filtrate was poured into ice water to deposit a precipitate, which was then thoroughly washed with water to obtain N-ethyl-N-phenylaminoethyl methacrylamide in the form of a white needle-like crystal. Thereafter, 1.1 g. of this methacrylamide and 0.5 g. of styrene were dissolved in 10 cc. of methylethylketone, and the resulting solution was added with 5 mg. of α,α′-azobisisobutyronitrile and then heated at 70° C. for 12 hours. This solution was poured into a large amount of methanol to obtain the exemplified compound (4) as a white polymer.

The photoactivators used in the present invention, i.e. polyhhalomethyl group-bearing photoactivators capable of yielding free radicals by the action of light, are compounds represented by the general formula,

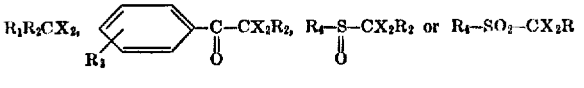

wherein $R_1$ is a hydrogen atom, an alkyl group, an aryl group, a halogen atom or a heterocyclic group; $R_2$ is a hydrogen or halogen atom; $R_3$ is a nitro group, a halogen atom or an alkyl group; and $R_4$ is an alkyl group, an aryl group or a heterocylic group.

Typical examples of the halogen-containing compounds represented by the above-mentioned general formulas are α,α,α-tribromoethanol,
p-nitri-α,α,α-tribromoacetophenone,
ω,ω,ω-tribromoquinaldine,
α-ω,ω,ω-tribromomethyl-5-nitroquinoline, α-ω,ω,ω-trichloromethyl-6-nitrobenzothiazole,
α-ω,ω-dibromomethyl-4-chloropyridine,
hexabromodimethyl sulfoxide,
tribromomethylphenylsulfone,
4-nitrotribromomethylphenylsulfone, and
α-tribromomethylsulfonyl benzothiazole.

Cellulose is one of the naturally occurring high molecular weight materials and may, chemically, be considered as an aliphatic polyhydric alcohol. It is a well known fact that many hydroxyl groups contained in cellulose are alkylated according to various procedures, whereby ether derivatives thereof can be produced. As the ether type derivatives of cellulose which are used in the present invention, there have been known many compounds which show various characteristics depending on their substitution degrees (esterification degrees). Typical examples of the ether type derivatives of cellulose are methyl cellulose, ethyl cellulose, n-propyl cellulose, isopropyl celluose, n-butyl cellulose, isobutyl cellulose, benzyl cellulose, hydroxypropylmethyl cellulose and hydroxyethylmethyl cellulose, but these are, of course, not limitative.

The present composition, which is composed of such specific polymer, photoactivator and cellulose ether as mentioned previously, is used in such a manner that the composition is dissolved in an organic solvent and the resulting solution is coated on such a support as an aluminum plate, zinc plate, copper plate, plastic film base or paper, followed by drying. As the organic solvent, there is used methanol, ethanol, acetone, dioxane, methyl Cellosolve or the like. The coating liquid according to the present invention is preferably composed of 100 parts by weight of the solvent, 1 to 50 parts by weight of the polymer, 0.1 to 50 parts by weight of the photoactivator and 0.01 to 5 parts by weight of the cellulose ether, though the proportions of the constituents are variable. In the said polymer, the hydrogen at the para-position to the amino group on the aromatic ring in the side chain thereof is active. On the other hand, the photoactivator, which is a polyhalomethyl group-bearing compound yields a carbon radical when the compound is irradiated with light. Accordingly, when a light-sensitive material containing said polymer and photoactivator is exposed, the active carbon in the paraposition to the amino group on the aromatic ring in the side chain of the polymer links to the carbon radical resulting from the methyl group of the photoactivator. As the result, the polymer successively reacts with the photoactivator to produce cross-linkages, whereby a faint image is formed. When this exposed surface is treated with a solvent capable of dissolving the polymer, the unexposed portion is removed, while the exposed portion forms a high molecular dye of a diphenylmethane or triphenylmethane type which, by the action of the cellulose ether contained in the composition, makes it possible to form a clear relief image excellent in chemical resistance.

The novel photoresist composition of the present invention can be sensitized. That is, the present photoresist composition can be greatly enhanced in sensitivity by addition of an acridine, merocyanine or styryl dye. Further, for easier understanding of the state of progress of development, a coloring matter may be added thereto.

The novel photoresist composition of the present invention is excellent in coatability and does not bring about dark reaction. When a light-sensitive material prepared by use of the present photoresist composition is exposed through a negative, the exposed portion, in which a faint image is formed, is greatly different in solubility in solvents from the unexposed portion, so that a clear relief image can be obtained, without necessitating any dyeing step, by treating the light-sensitive material with a solvent capable of dissolving the unexposed polymer. The thus obtained relief image is higher in chemical resistance than a relief image obtained by use of a light-sensitive composition comprising only the said polymer and photoactivator and, when formed into a photoresist, it is highly resistant to etching solution and is useful for name plate, printing wiring, anastatic printing, lithographic printing, gravure printing, etc.

The present invention is illustrated in further detail below with reference to examples.

Example 1.—A solution in 10 cc. of methylethylketone of 0.5 g. of p-nitro-tribromomethylphenyl sulfone, 0.7 g. of styrene-N-ethyl-N-phenylaminoethyl acrylamide (1:1) copolymer and 0.07 g. of hydroxymethylpropyl cellulose was coated on an aluminum plate and then dried. The coated aluminum plate was superposed with a negative, set in a vacuum printing machine and then exposed for 10 minutes to a 500 w. tungsten lamp to obtain a pale blue positive image. This aluminum plate was rubbed with dioxane-impregnated absorbent cotton, whereby the unexposed portion was dissolved off and a deep blue positive relief image was formed on the aluminum plate. Since the hydroxypropylmethyl cellulose had been incorporated, the solution was improved in coatability and the relief image was increased in strength. The thus obtained relief image was successfully usable for name plate and the like.

Example 2.—A solution in 80 cc. of dioxane of 5 g. of poly(N-phenyl-N-acryloyl hydrazine), 5 g. of hexabromodimethyl sulfone and 0.2 g. of ethyl cellulose (substitution degree 2.3, ethoxyl content 46%) was coated on a grained aluminum plate and then dried. The coated aluminum plate was superposed with a negative, set in a vacuum printing machine and exposed for 2 minutes to a 30 amp. arc-lamp at a distance of 50 cm. Subsequently, the aluminum plate was slightly rubbed with dioxane-impregnated absorbent cotton, whereby the unexposed portion was removed to obtain a pink positive image. After thoroughly washing with water, the plate was moistened with water and then subjected to an offset printing machine, whereby prints bearing an excellent image could be obtained. Since the ethyl cellulose had been incorporated, the light-sensitive solution was enhanced in film forming ability and the image was increased in printing resistance.

Example 3.—A solution in 100 cc. of dioxane of 6 g. of α-tribromomethylsulfonyl benzothiazole, 6 g. of N-ethyl-N-phenylaminoethyl methacrylate-methacrylic acid (4:6) copolymer and 0.3 g. of methyl cellulose (substitution degree 2.6, methoxyl content 41%) was coated by use of a rotary coater on a polished printing zinc plate and then dried. Using a vacuum printing machine with chemical lamps, the coated zinc plate was exposed through a negative to obtain a pale blue positive image. Subsequently, the zinc plate was immersed for 10 seconds in a 10% aqueous caustic soda solution kept at 65° C. thereby to effect development. The unexposed portion was removed to yield a deep blue positive resist image which was excellent in chemical resistance. The resist image was immediately etched, without burning, with a Dow etching solution, washed with water and then subjected to an anastatic printing machine to obtain a large number of clear prints.

For comparison, the said zinc plate was coated with a light-sensitive solution prepared in the same manner as above, except that the methyl cellulose was not incorporated. The coated zinc plate was exposed and then immersed in a 10% aqueous caustic soda solution, whereby not only the unexposed portion but also the exposed portion immediately softened and dissolved out and no relief image could be obtained.

What we claim is:

1. A light-sensitive photoresist composition which comprises (1) a homopolymer of a monomer represented by the general formula,

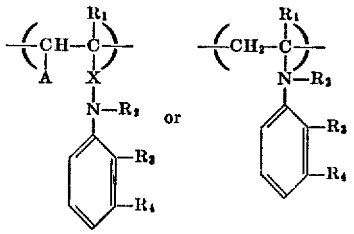

(I) (II)

wherein A is a hydrogen atom or a carboxyl group; X is a group selected from

—$COOCH_2CH_2$—, —$CONHCH_2CH_2$—, —CONH—, —$CH_2$—, $\phi SO_2NH$—, —$\phi SO_2O\phi$— and —$CONH\phi$— groups; $R_1$ is a hydrogen atom or a lower alkyl group; $R_2$ is a hydrogen atom, a lower alkyl group or a phenyl group; and $R_3$ and $R_4$ are individually a hydrogen atom or a lower alkyl group, provided that in Formula II, $R_2$ and $R_3$ may form a heterocyclic ring together with the nitrogen and the benzene ring, or $R_3$ and $R_4$ may form a naphthalene ring together with the benzene ring or a copolymer of said monomer with other vinyl monomers, (2) a polychloromethyl or polybromomethyl group bearing photoactivator capable of yielding a free radical by the action of light, and (3) a cellulose ether.

2. A light-sensitive photoresist composition according to claim 1, wherein said photoactivator is in amount of about 0.2 to 2.0 parts by weight per part of the homopolymer or copolymer and said cellulose ether is in amount of about 0.01 to 0.2 part by weight per part of the homopolymer or copolymer.

3. A light-sensitive photoresist composition according to claim 1, wherein said photoactivator is one member selected from α,α,α - tribromoethanol, p - nitro-α,α,α-tribromoacetophenone, tribromomethylphenylsulfone, α-ω,ω,ω-tribromomethyl-5-nitroquinoline and α-ω,ω,ω-trichloromethyl-6-nitrobenzothiazole.

4. A light-sensitive photoresist composition according to claim 1, wherein said cellulose ether is methylcellulose, ethylcellulose or hydroxyethylmethylcellulose.

5. A light-sensitive photoresist composition according to claim 1, wherein said homopolymer is poly (N-ethyl-N-phenylaminoethyl acrylamide).

6. A light-sensitive photoresist composition according to claim 1, wherein said homopolymer is poly (N-phenyl-N-acryloyl hydrazine).

7. A light-sensitive photoresist composition according to claim 1, wherein said copolymer is N-ethyl-N-phenylaminoethyl methacrylate-methacrylic acid copolymer.

8. A light-sensitive photoresist composition according to claim 1, wherein said copolymer is N-ethyl-N-phenylaminoethyl methacrylate-styrene copolymer.

References Cited

UNITED STATES PATENTS

| | | | |
|---|---|---|---|
| 3,579,343 | 5/1971 | Kogure et al. | 96—90 R |
| 2,927,023 | 3/1960 | Martin | 96—115 P |
| 2,544,905 | 3/1951 | Van Deusen | 96—115 R |

RONALD H. SMITH, Primary Examiner

U.S. Cl. X.R.

96—115 R